(12) United States Patent
Van Mierlo et al.

(10) Patent No.: US 8,476,167 B2
(45) Date of Patent: Jul. 2, 2013

(54) LITHOGRAPHIC APPARATUS AND METHOD OF MANUFACTURING AN ELECTROSTATIC CLAMP FOR A LITHOGRAPHIC APPARATUS

(75) Inventors: Hubert Adriaan Van Mierlo, Maassluis (NL); Erik Leonardus Ham, Steenbergen (NL); Hendricus Johannes Maria Meijer, Veldhoven (NL); Hendrik Antony Johannes Neerhof, Eindhoven (NL); Joost Jeroen Ottens, Veldhoven (NL); Johannes Adrianus Petrus Leijtens, Bleiswijk (NL); Marco Le Kluse, Maassluis (NL); Jan Hopman, Delft (NL); Johannes Hubertus Josephina Moors, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 84 days.

(21) Appl. No.: 13/020,399

(22) Filed: Feb. 3, 2011

(65) Prior Publication Data
US 2011/0126406 A1    Jun. 2, 2011

Related U.S. Application Data

(62) Division of application No. 11/312,651, filed on Dec. 21, 2005, now abandoned.

(51) Int. Cl.
*H01L 21/311* (2006.01)
(52) U.S. Cl.
USPC ................. 438/694; 216/17; 216/18; 216/39; 438/700

(58) Field of Classification Search
USPC .......................................................... 361/234
See application file for complete search history.

(56) References Cited

U.S. PATENT DOCUMENTS

| 4,384,918 | A | | 5/1983 | Abe |
|---|---|---|---|---|
| 4,502,094 | A | | 2/1985 | Lewin et al. |
| 5,315,473 | A | * | 5/1994 | Collins et al. ................. 361/234 |
| 5,426,558 | A | | 6/1995 | Sherman |
| 5,636,098 | A | | 6/1997 | Salfelder et al. |
| 5,838,529 | A | * | 11/1998 | Shufflebotham et al. ..... 361/234 |

(Continued)

FOREIGN PATENT DOCUMENTS

| EP | 0 947 884 A2 | 10/1999 |
|---|---|---|
| EP | 1 191 581 A1 | 3/2002 |
| JP | 2000-332091 A | 11/2000 |

OTHER PUBLICATIONS

Korean Office Action directed to related Korean Application No. 10-2006-0132156, mailed May 9, 2008, Korean Patent Office; 6 pages.

(Continued)

*Primary Examiner* — Lan Vinh
*Assistant Examiner* — Jiong-Ping Lu
(74) *Attorney, Agent, or Firm* — Sterne, Kessler, Goldstein & Fox P.L.L.C.

(57) ABSTRACT

The invention relates to a method of manufacturing an electrostatic clamp configured to electrostatically clamp an article to an article support in a lithographic apparatus. The method includes providing a first layer of material, etching a recess in the first layer of material, and disposing an electrode in the recess of the first layer of material.

13 Claims, 4 Drawing Sheets

U.S. PATENT DOCUMENTS

| | | | | |
|---|---|---|---|---|
| 5,976,393 | A * | 11/1999 | Abe | 216/18 |
| 6,864,957 | B2 | 3/2005 | Van Elp et al. | |
| 7,209,339 | B2 | 4/2007 | Kitabayashi et al. | |
| 2004/0012767 | A1 * | 1/2004 | Van Elp et al. | 355/72 |
| 2004/0219736 | A1 * | 11/2004 | Yoshitaka | 438/222 |
| 2004/0240513 | A1 | 12/2004 | del Puerto | |
| 2005/0168908 | A1 * | 8/2005 | Maeda et al. | 361/234 |
| 2006/0157851 | A1 * | 7/2006 | Kawashima | 257/750 |

OTHER PUBLICATIONS

Frederikse, H.P.R., "Permittivity(Dielectric Constant) of Inorganic Solids," from the Handbook of Chemistry and Physics, 12-44, Copyright 2008, printed on Mar. 19, 2009 from http://www.hbcpnetbase.com/.

Non-Final Rejection directed to related U.S. Appl. No. 11/312,651, filed Dec. 21, 2005, mailed Mar. 25, 2009; 15 pages.

Final Rejection directed to related U.S. Appl. No. 11/312,651, filed Dec. 21, 2005, mailed Sep. 29, 2009; 11 pages.

Non-Final Rejection directed to related U.S. Appl. No. 11/312,651, filed Dec. 21, 2005, mailed Jan. 13, 2010; 13 pages.

Final Rejection directed to related U.S. Appl. No. 11/312,651, filed Dec. 21, 2005, mailed Jun. 8, 2010; 14 pages.

Non-Final Rejection directed to related U.S. Appl. No. 11/312,651, filed Dec. 21, 2005, mailed Nov. 4, 2010; 12 pages.

* cited by examiner

LITHOGRAPHIC APPARATUS AND METHOD OF MANUFACTURING AN ELECTROSTATIC CLAMP FOR A LITHOGRAPHIC APPARATUS

CROSS REFERENCE TO RELATED APPLICATIONS

This application is a divisional of pending U.S. patent application Ser. No. 11/312,651, filed Dec. 21, 2005. The entirety of the foregoing application is incorporated by reference herein.

BACKGROUND OF THE INVENTION

1. Field

The present invention relates to a lithographic apparatus, a method for manufacturing a device and an apparatus manufacturing method.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Electrostatic clamps may be used in lithographic apparatuses operating at certain wavelengths, e.g. EUV, since at these wavelengths, certain regions of the lithographic apparatus operates under vacuum conditions. An electrostatic clamp may be provided to electrostatically clamp an article, such as a mask or a substrate to an article support, such as a mask table or a wafer table, respectively. Conventional electrostatic clamps comprise a stack in which an electrode is disposed between an upper (first) and a lower (second) dielectric or isolating layer. For example, the lower layer is polished, then the electrode is deposited on the upper polished surface. Then the upper layer is placed on top of the electrode. The upper and lower layers are bonded together with, for example, anodic bonding. The electrode may comprise a plurality of portions. Particles on an upper surface of the electrode lead to unacceptable stresses in the upper layer after the bonding step. Further, the electrodes do not necessarily cover the entire surface of the lower layer. At some places no electrode may be present. This may result in small, but relatively long, gaps that can fill with one or more contaminants, such as air, dirt, a fluid or a combination thereof. In any of these cases, this may lead to unacceptable stresses in the upper layer, which may result in damage to the article or breakthrough between the different electrode portions, eg. a short circuiting of the electrode. Further, a contaminant may becomes trapped in the stack between the layers. When the clamp is subject to differing pressure environments, in particular, the upper layer may suffer from alternating forces which may lead to damaging of a layer.

SUMMARY

It would be advantageous, for example, to provide an electrostatic clamp in which stresses are reduced. It would be advantageous, for example, to provide an electrostatic clamp in which chances of damage to the article, the clamp, breakthrough or a combination thereof are reduced.

According to an aspect of the invention, there is provided a method of manufacturing an electrostatic clamp configured to electrostatically clamp an article to an article support in a lithographic apparatus, the method comprising: providing a first layer of material; etching a recess in the first layer of material; and disposing an electrode in the recess of the first layer of material.

According to an aspect of the invention, there is provided a lithographic apparatus comprising: an article support constructed to support an article in a beam path of a radiation beam; an electrostatic clamp configured to electrostatically clamp the article against the article support; the electrostatic clamp being provided with a first layer of material and an electrode. The electrode is formed in a recess etched in the first layer of material.

According to an aspect of the invention, there is provided a lithographic apparatus comprising: an article support constructed to support an article in a beam path of a radiation beam; an electrostatic clamp configured to electrostatically clamp the article against the article support; the electrostatic clamp being manufactured with a method discussed herein.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
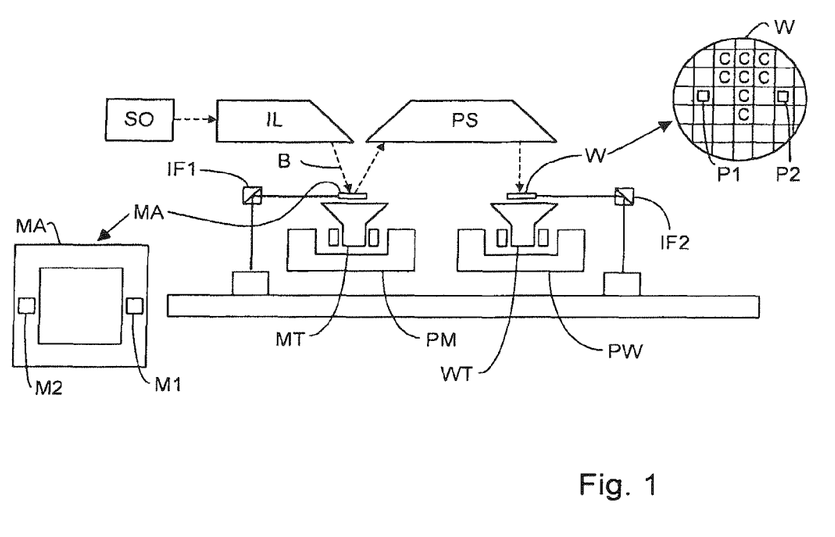
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters;

and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general teem "projection system".

The support structure and the substrate table may also be hereinafter referred to as an article support. An article includes but is not limited to a patterning device, such as a reticle, and a substrate, such as a wafer.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
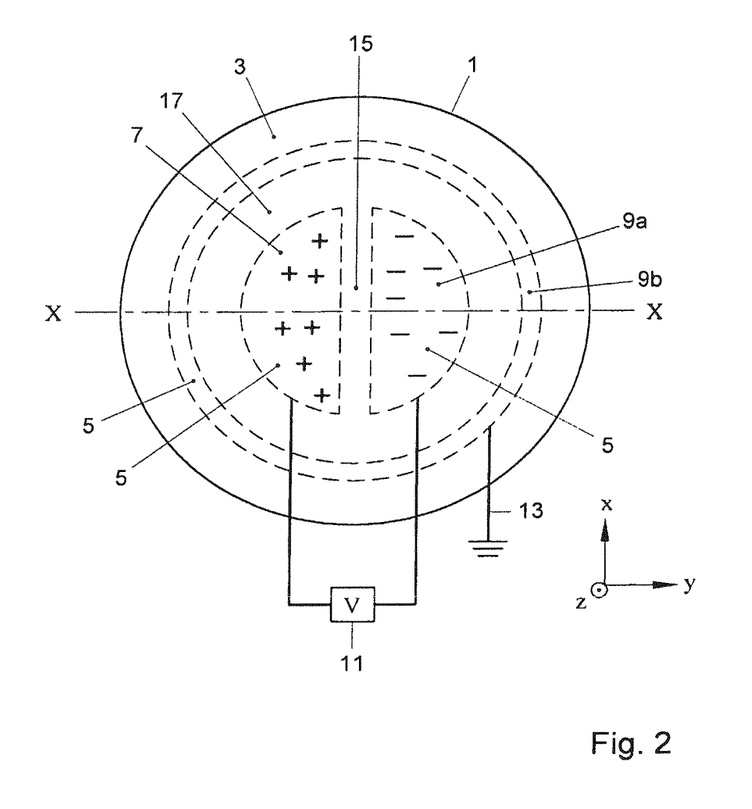
FIG. 2 depicts a plan view of an electrostatic clamp according to an embodiment of the invention.

FIG. 2 depicts a plan view of an electrostatic clamp according to an embodiment of the invention. As shown in FIG. 2, the electrostatic clamp 1 may form part of an article support 3. The article W, MA is disposed on the article support 3. To maintain the article W, MA supported in a stable manner on the support, the clamp 1 provides a clamping force, i.e., the article W, MA is attracted onto the article support 3, for instance, by electrostatic clamping. To this end, it will be understood that embodiments of the present invention may be applied to any article, in particular, a flat article, to be placed in a projection beam, such as an optical element, such as a reflective or transmissive mask, or to a substrate to be irradiated, such as a wafer. Hereinbelow, a mask MA is generally referred to as a first article, a wafer or substrate W is generally referred to as a second article. The electrostatic clamp comprises an electrode 5. The electrode may comprise a first portion 7 and a second portion 9. The first portion 7 is a first electrode portion. The second portion 9 may be a second electrode portion 9a or a shielding electrode portion 9a.

Figure 3:
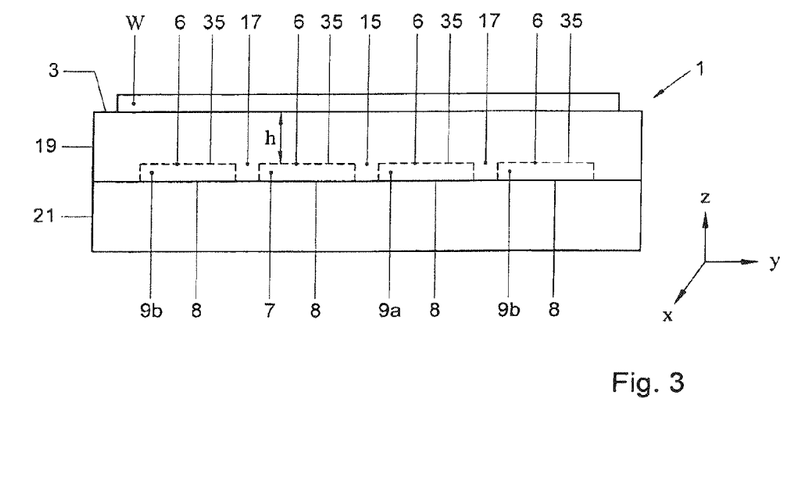
FIG. 3 depicts a cross section of an electrostatic clamp through X-X in FIG. 2 according to an embodiment of the invention.

A voltage supply 11 may be provided which is configured to supply a voltage to the first or second electrode portion 7, 9a. The second electrode portion 9b may be grounded by the provision of an earth connection 13. As shown in FIG. 3, the electrostatic clamp comprises a stack. The stack comprises the electrode 7, 9 disposed so that a first surface 6 of the electrode is in contact with a first layer 19 and a second surface 8 of the electrode is in contact with a second layer 21. The dielectric or semi-dielectric layers 19, 21 are provided in order to maintain a charge provided on at least the first portion 7. The stack configuration is described in more detail with reference to FIGS. 3-5. In FIG. 2, the electrode 7, 9 is depicted in dotted lines in order to indicate that the electrode is disposed in the stack structure of the electrostatic clamp 1. In other words, the electrode is not disposed on an outer surface of the clamp 1. Further, the electrical connections to the voltage supply 11 and earth 13 may also be provided within the stack structure of the electrostatic clamp 1.

Figure 4:
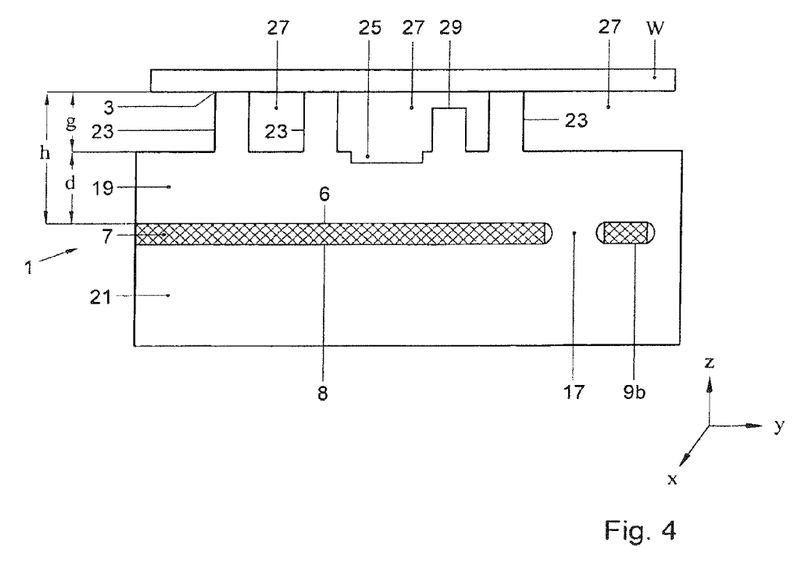
FIG. 4 depicts a cross section of an electrostatic clamp according to a further embodiment of the invention.

The electrostatic clamp 1 operates on the accepted principle that an electrostatic charge is built up and maintained on at least the first electrode portion 7. A force is generated in accordance with the following equation:

$$F = \tfrac{1}{2} * A * eps0 * V^2 / (d/epsr + g)^2 \qquad \text{(equation 1)},$$

where F is force in Newtons, A is area in meters squared of the electrode to which a charge is applied, V is voltage in volts, g is the gap between the dielectric layer or semi-dielectric layer and the article (and is also the height of a protrusion 23, discussed in further detail below), epsr is the dielectric constant of the dielectric or semi-dielectric material and eps0 is the dielectric constant of vacuum, and d is the distance between the electrode and the base of the protrusion 23 (see FIG. 4). The distance h between the wafer and the electrode is thus, g+d, and as shown for example, in FIGS. 3 and 4. In FIG. 2, a bipolar clamp is provided in which a positive charge is established on the first portion 7 and a negative charge is established on the second portion 9a. In this way, the electrode may be attached to a controlled resistance in order to establish a predetermined electrostatic force to clamp the article. The shielding electrode 9b comprising the second portion 9b is provided in order to reduce the chance of a discharge occurring in accordance with the Paschen curve of the fluids, for example, gases, that are between the article and the clamp.

In particular, it has been found that contaminants located in a volume 15 extending between the first portion 7 and the second portion 9a, may lead to problems mentioned above. Further, contaminants located in a volume 17 extending between the first and second portion 7, 9a forming the bipolar electrode and the second portion 9b forming the shielding electrode may also lead to problems mentioned above.

FIG. 3 depicts a cross section of an electrostatic clamp through X-X in FIG. 2 according to an embodiment of the invention. In FIG. 3, the article support 3 is constructed to support a second article to be placed in a beam path of the patterned radiation beam. The electrostatic clamp 1 is configured to electrostatically clamp the second article W against the article support 3 during projection of the beam along the beam path. The electrostatic clamp 1 comprises a stack comprising a first and second layer 19, 21 and an electrode 7, 9a, 9b. The first layer may comprise a dielectric or semi-dielectric material. The second layer may comprise a dielectric, a semi-dielectric or an isolator material, or a combination thereof. It is not necessary that the second layer support an electric field. The electrode may comprise a first and a second portion 7, 9a, 9b, wherein the electrode 7, 9a, 9b is disposed so that a first surface 6 of the electrode 7, 9a, 9b is in contact with the first layer 19 and a second surface 8 of the electrode 7, 9a, 9b is in contact with the second layer 21. The first layer may be configured to receive the article. The first and second dielectric or semi-dielectric layer 19, 21 may comprise a dielectric or semi-dielectric material which supports an electrostatic field so that, in use, the electrostatic clamp electrostatically clamps the article against the first layer 19. The material of either the first or the second dielectric or semi-dielectric layer may be provided between the first and second layer. In this way, an electrostatic clamp is provided which requires no gluing. In one embodiment, the material fills one or more volumes 15, 17 between the first and second layer 19,21. The material may surround the electrode 7, 9a, 9b. In one embodiment, the material is provided between the first and second portions of the electrode 7, 9a, 9b. In one embodiment, the first and second layer comprise the same material. In this way, differences in thermal expansion coefficients of the first and second layer are ruled out, which results in a structure in which the effects of thermal stress is reduced.

In the embodiment shown in FIG. 3, the electrode 7, 9a, 9b is formed in the first layer. In a further embodiment, the electrode 7, 9a, 9b is disposed on one of the dielectric or semi-dielectric layers 19, 21. The electrode 7, 9a, 9b may extend in a plane, wherein the first and second portions 7, 9a, 9b extend in the plane. In the embodiment shown in FIG. 3, the electrode 7, 9a, 9b may formed in the first or second dielectric or semi-dielectric layer 19, 21. In particular, it may be formed in the first dielectric or semi-dielectric layer 19. In the embodiment shown in FIG. 3, the electrode 7, 9a, 9b is formed in a recess 35 etched in the first or second dielectric or semi-dielectric layer. In FIG. 3, the distance h between the electrode and the wafer is indicated.

In an embodiment in which the article support is constructed to support a first article MA capable of imparting a radiation beam with a pattern in its cross-section to form a patterned radiation beam in a beam path of the radiation beam. In reflective lithographic apparatuses, for example, those operating in a EUV range, the article support for the mask and the electrostatic clamp may be constructed in a manner similar to that described for a substrate, since the beam is not transmitted through the mask. However, in transmissive lithographic apparatuses, where the radiation beam is transmitted through the mask, the article support 3 and electrostatic clamp may be constructed in order to allow the projection beam to pass through. This may be achieved by arranging the electrodes towards the edge of the electrostatic clamp.

The first and second layers may comprise a material such as an ultra low expansion material, such as ULE®, a glass material, a ceramic material, a glass ceramic material, such as ZERODUR®, or a combination thereof. U.S. Pat. No. 6,864,957, incorporated herein by reference, discloses more details of a suitable material. ULE® is an ultra-low-expansion glass available from Corning. ULE® is a dielectric material, i.e. it is a poor conductor of electricity, but an efficient supporter of an electrostatic field. There is very little flow of charge in the material when the material is subject to an electrostatic field. The dielectric constant of ULE® is about 4 at about 1 kHz. ZERODUR® is a glass ceramic material, available from Schott, with an extremely low thermal expansion coefficient. ZERODUR® is a semi-dielectric material, i.e. it is a poor conductor of electricity and an efficient supporter of an electrostatic field. However, there is some flow of charge in the material when the material is subject to an electrostatic field. ZERODUR® has a dielectric constant of about 8 at about 1 kHz. It is noted that the dielectric constants vary with frequency. However, in accordance with embodiments of the invention, the voltage provided may be DC. However, the flow of charge in the material when in use in embodiments of the present invention, does not compromise the clamping function of the electrostatic clamp. In this way, in spite of some charge flowing in the material, a semi-dielectric material, such as ZERODUR® may be used in the electrostatic clamp. The dielectric or semi-dielectric materials may have a dielectric constant of between about 1 and about 8 at about 1 kHz.

In the embodiment shown in FIG. 3, the first layer 19, also referred to as the upper layer, is comprised of an ultra low expansion material, such as ultralow expansion glass available from Corning. The second layer 21, may be formed of the same material or another material. Ultralow expansion glass (e.g. ULE®) is substantially non-expanding when subject to heat. If heated above a certain temperature, it may flow. In this way, by heating, ULE® can be cast in to a predetermined shape or form. Further, ULE® can be heated so that separate elements can be fused together to form complex structures. A further material which may be used for the first, second or both layers 19, 21 is ZERODUR®. ZERODUR® is suitable for use in an electrostatic clamp, since in spite of being a semi-dielectric material, the current which flows in the material is not enough to substantially affect the function of the electrostatic clamp. In the embodiment shown in FIG. 3, the first and second layers are dielectric and are formed of ULE®. The electrode 7, 9a, 9b is formed of a conventional material, such as aluminum or silicon. In fact, the electrode 7, 9a, 9b may comprise a material of any metal which can be oxidized provided that the oxide layer which forms on the metal is not too thick to allow a voltage or earth connection to be applied to the electrode.

As shown in FIGS. 3 and 4, the one or more volumes 15, 17, in particular, volume 17 in FIG. 4, is filled with a material of the first or second dielectric material. The one or more volumes being the one or more volumes between the first and second portions. In particular, the one or more volumes comprises a solid state material. In this way, the reliability of the clamp is improved, since contaminants are prevented from entering the volume between the first and second portions 7, 9a, 9b. In this way, the possibility of having trapped volumes of a contaminant, in particular, a gas, within the electrostatic clamp stack is reduced. In this way, internal forces within the clamp during pumping and venting are reduced. As mentioned above, the material filling the one or more volumes comprises an ultra low expansion material, a glass material, a ceramic material, ZERODUR®, or a combination thereof. The material in the one or more volumes between the first and second portions is configured to reduce contamination of air, other contaminants, or a combination thereof from entering the one or more volumes. In this way, contamination within the electrostatic clamp may be reduced. As a result, the clamp may be more robust. Further, the reliability of the clamp is improved. It is to be noted that the embodiment shown in FIG. 4 has application for an electrostatic clamp for clamping a mask, in particular a mask for use in an apparatus operating in the EUV wavelength range.

Figure 5:
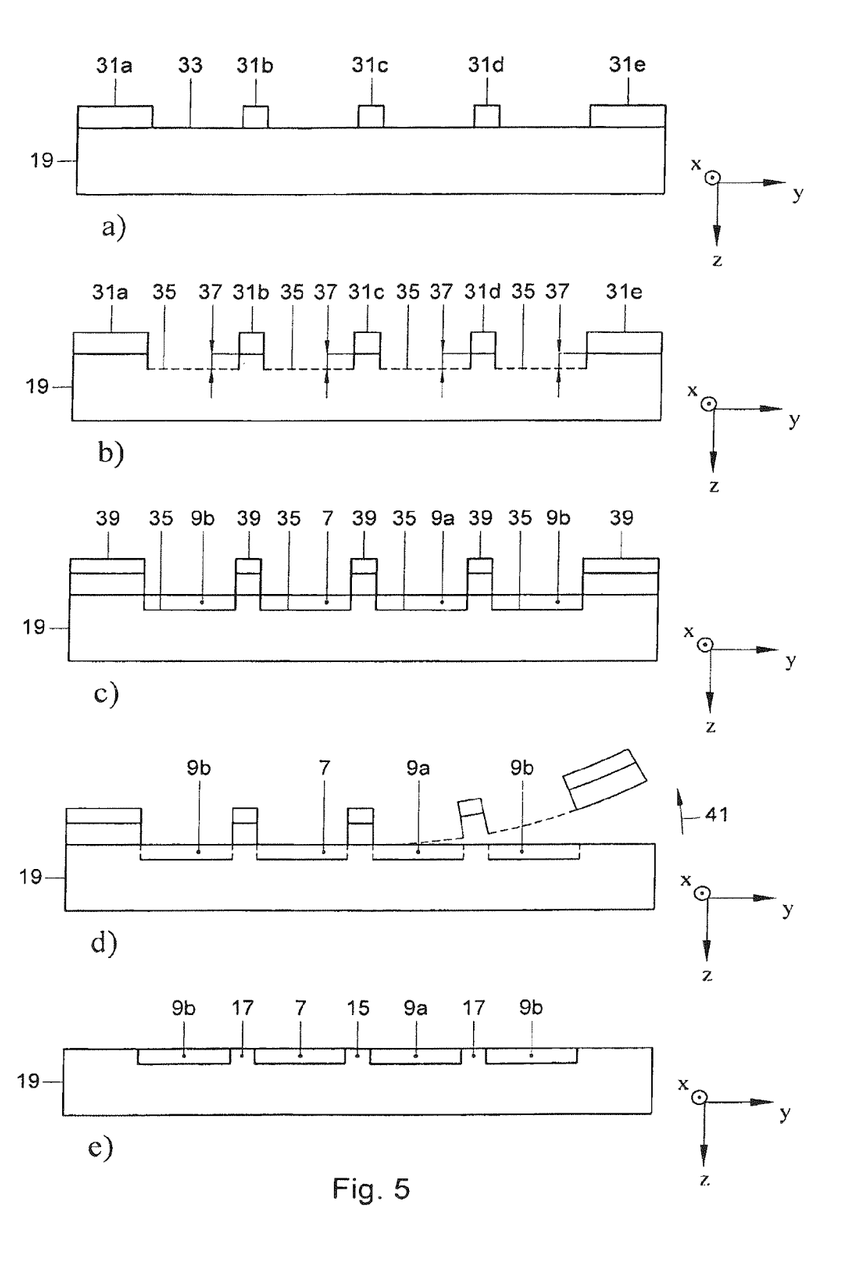
FIGS. 5A-E depict the manufacture of an electrostatic clamp as depicted, for example, in FIGS. 2 and 3 according to an embodiment of the invention.

The method of manufacture of the stack shown in FIG. 3 is described in more detail with reference to FIG. 5.

FIG. 4 depicts a cross section of an electrostatic clamp according to a further embodiment of the invention. In the embodiment shown in FIG. 4, the electrostatic clamp comprises second dielectric or semi-dielectric layer 21 on which the electrode 7, 9b is disposed. In the embodiment shown in FIG. 4, the first and second portions 7, 9b are disposed on the second layer 21. During this stage of the manufacture of the clamp shown in FIG. 4, a gap exists in the volume 17. The first dielectric or semi-dielectric layer 19 is disposed on the electrode 7, 9b, which is disposed on the second dielectric or semi-dielectric layer 21 to form a stack in which the electrode 7, 9b is disposed between the first and second dielectric or semi-dielectric layer 19, 21.

Subsequently, the first layer 19 (the upper layer) is fused directly on top of the second layer 21 (the lower layer), so that the one or more volumes between the first and second portions is substantially filled with material of the first layer. This is achieved by heating the stack until the dielectric or semi-dielectric material flows into the one or more volumes 17 between the first and second portions 7, 9b. The temperature to which the second layer or stack is heated depends on the material used for the first, second layer and the electrode. The first layer may comprise an ultra low expansion material (such as ULE®), a glass material, a ceramic material, a glass ceramic material (such as ZERODUR®), or a combination thereof. The fusing may further comprise applying heat to the stack, applying pressure to the stack or a combination thereof. Again, the pressure, temperature or combination thereof applied to the stack or individual components of the stack may vary depending on the material used for the components. It is noted that in FIG. 4, the one or more volume 17 depicted is the volume between the first electrode portion 7 and the shielding electrode 9b. The embodiment shown is equally applicable to a volume 15 between the first and second portions 7, 9a. Further, the manufacturing method described with reference to FIG. 5 is also equally applicable to the electrostatic clamp shown in FIG. 4. Similarly, the manufacturing method described with reference to the electrostatic clamp shown in FIG. 4 is equally applicable to the electrostatic clamp shown in FIG. 3.

As depicted in FIG. 4, the article support 3 is provided with a plurality of protrusions 23 (also referred to in the art as burls), such as described with reference to European Patent No. EP0947884, published Oct. 6, 1999, which is incorporated herein by reference thereto. The protrusions 23 provide a flat plane of support, so that during the lithographic process, the article MA, W may be maintained level in the optimal way. To keep the article M stable to the article support 3, the clamp 1 provides a clamping force, that is the article M is pressed onto the article support 3, by electrostatic clamping.

During the lithographic process, a back fill gas delivery groove 25 having a width in the y direction of approximately 1 millimeter may supply a back fill gas to a cavity 27 between the article MA, W and the article support MT, 3 to enhance thermal contact of the article W and the article support 3. In this way, illumination performance is improved, since the chances of the article MA, W overheating are reduced, which overheating may result in thermal deformation or even loss. Conventionally, after the lithographic process, the backfill gas is pumped away by a backfill gas pump (not shown). The back fill gas pump may comprise a separate unit for feeding the gas into the cavity 27 and a separate unit for extracting the gas from the cavity 27. A sealing ring 29 may also be provided. The dimensions shown in FIG. 4 are shown by way of example only. It will be understood that the dimensions may vary depending on the particular embodiment.

FIGS. 5A-E depict the manufacture of an electrostatic clamp as depicted, for example, in FIGS. 2 and 3 according to an embodiment of the invention.

In one embodiment, the method comprises manufacturing an electrostatic clamp configured to electrostatically clamp an article W, MA to an article support 3 in a lithographic apparatus, the method comprising: disposing an electrode 7, 9 between a first and a second dielectric or semi-dielectric layer 19, 21 to form a stack, wherein the electrode 7, 9 comprises a first and a second portion 7, 9a, 9b, and providing in one or more volumes 15, 17 lying between the first and second portions 7, 9a, 9b, a material of either the first of the second dielectric or semi-dielectric layer.

With reference to FIGS. 5A-E, it is seen that the dielectric or semi-dielectric layer 19 shown is the first layer 19, which eventually is oriented as the upper layer in FIG. 3. In the embodiments shown in FIG. 5, the first layer may comprise ULE®

With reference to FIG. 5A, a mask 31 is disposed on a surface 33 of the first dielectric or semi-dielectric layer 19. The mask 31 masks those volumes 31a-31e where it is not desired that an electrode is to be formed. In other words, the mask 31 masks the one or more volumes 15, 17 between the first and second portions 7, 9a, 9b of an electrode which is yet to be deposited on the first dielectric or semi-dielectric layer 19.

As depicted in FIG. 5B, subsequently, the method comprises etching a layer 35, the etched volume being depicted as a dotted line, from the surface 33 of the first dielectric or semi-dielectric layer 19 on which the mask 31 is disposed, wherein the layer 35 etched from the mask bearing surface 33 has a depth 37 approximately the same as the thickness of the electrode yet to be disposed on the first dielectric or semi-dielectric layer 19. The etching process may be carried out in a conventional manner. Typically, the etch depth is in the region of 300 nanometers which corresponds to the depth of the electrode which it is desired to form on the layer 19. However, depending on the desired depth of the electrode to be formed, the etch depth will vary. The etching parameters including an etching duration may be determined in accordance with the desired etch depth. In one embodiment, a difference may exist between the depth of the one or more volumes etched in the first layer and the thickness of the electrode. In which case, the depth is within a tolerance band of the electrode.

As depicted in FIG. 5C, the method may further comprise providing a coating 39 of an electrode material on an etched surface 35 to form the electrode 7, 9, wherein the coating 39 has a thickness approximately the same as the thickness of the layer etched from the mask bearing surface 33. 20. As shown, the coating 39 may also cover the mask 31. The coating comprises an electrode material. It may be formed by a sputtering process, chemical vapor deposition process or a combination thereof. The thickness of the electrode may be controlled by controlling the time of the coating process in a conventional way.

As depicted in FIG. 5D, the method may further comprise removing, as indicated by arrow 41, the mask 31 from the first dielectric or semi-dielectric layer. This method may also be referred to as a lift off process in the art. Any coating deposited on the mask may also be removed together with the mask.

As depicted in FIG. 5E, the electrode is formed in the first layer. This construction may be cleaned.

Subsequently, the method may comprise bonding the first dielectric or semi-dielectric layer 19 in which the electrode 7, 9 is formed to the second dielectric or semi-dielectric layer 21 to form a stack. The bonding method may comprise anodic bonding.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method comprising:
    disposing a mask on a surface of a first layer;
    forming at least one recess in the surface of the first layer at locations not covered with the mask, the first layer configured to receive an article by contact at a second surface to electrostatically clamp an article to an article support;
    providing a coating of an electrode material on a surface of the mask and in the at least one recess;
    removing the mask from the surface of the first layer; and
    bonding the first layer with a second layer.

2. The method according to claim 1, wherein the disposing a mask defines a shape of an electrode in the first layer.

3. The method according to claim 2, wherein the recess formed in the first layer has a depth approximately same as a thickness of the electrode in the first layer.

4. The method according to claim 2, wherein the coating has a thickness approximately same as a depth of the formed recess.

5. The method according to claim 4, wherein the providing the coating comprises using a sputtering process, chemical vapor deposition process, or a combination thereof.

6. The method according to claim 1, wherein each of the first layer and the second layer comprises a dielectric or semi-dielectric layer.

7. The method according to claim 1, wherein the bonding comprises anodic bonding.

8. The method according to claim 1, wherein the bonding comprises applying heat to the first and second layers, applying pressure to the first and second layers, or a combination thereof.

9. The method according to claim 1, wherein the first layer comprises an ultra low expansion material, a glass material, a ceramic material, or a combination thereof.

10. The method according to claim 9, wherein the first layer comprises ultra low expansion material.

11. The method according to claim 9, wherein the first layer comprises glass ceramic material.

12. The method according to claim 1, wherein the first and second layers comprise same material.

13. The method according to claim 1, wherein the first and second layers comprise different materials.

* * * * *